US012761304B2

(12) United States Patent
Bacher et al.

(10) Patent No.: US 12,761,304 B2
(45) Date of Patent: Oct. 13, 2026

(54) METHOD FOR ASSIGNING A SPATIAL ORIENTATION TO A MOVEMENT SIGNAL OF A MOVEMENT OF AN EXAMINATION OBJECT OF A MAGNETIC RESONANCE EXAMINATION, MAGNETIC RESONANCE APPARATUS, AND COMPUTER PROGRAM PRODUCT

(71) Applicant: Siemens Healthineers AG, Forchheim (DE)

(72) Inventors: Mario Bacher, Diepersdorf (DE); Johann Sukkau, Herzogenaurach (DE); Peter Speier, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 189 days.

(21) Appl. No.: 18/654,158

(22) Filed: May 3, 2024

(65) Prior Publication Data

US 2024/0369661 A1 Nov. 7, 2024

(30) Foreign Application Priority Data

May 3, 2023 (DE) ..................... 10 2023 204 096.4

(51) Int. Cl.
*G01R 33/56* (2006.01)
*G01R 33/563* (2006.01)

(52) U.S. Cl.
CPC ... *G01R 33/5608* (2013.01); *G01R 33/56308* (2013.01)

(58) Field of Classification Search
CPC .......... G01R 33/5608; G01R 33/56308; G01R 33/5673; G01R 33/5676; G01R 33/56509
See application file for complete search history.

(56) References Cited

U.S. PATENT DOCUMENTS

2016/0245888 A1 8/2016 Bollenbeck
2017/0160364 A1 6/2017 Fenchel
(Continued)

FOREIGN PATENT DOCUMENTS

DE 102020201102 A1 8/2021
EP 3413076 A1 12/2018
EP 3633401 A1 4/2020

OTHER PUBLICATIONS

Vahle et al., Respiratory Motion Detection and Correction for MR Using the Pilot Tone: Applications for MR and Simultaneous PET/MR Examinations. Invest Radiol. Mar. 2020;55(3):153-159 (Year: 2020).*
(Continued)

*Primary Examiner* — Daniel R Miller
(74) *Attorney, Agent, or Firm* — Lempia Summerfield Katz LLC

(57) ABSTRACT

A method for assigning a spatial orientation to a movement signal of a movement of an examination object of a magnetic resonance examination, a magnetic resonance apparatus and a computer program product. According to the method, a first movement signal is captured by means of a first movement capture method. During the capture of the first movement signal, at least one further movement signal is captured by means of at least one further movement capture method. A spatial orientation is assigned to at least one component of the first movement signal by comparing the first movement signal with the at least one further movement signal.

19 Claims, 2 Drawing Sheets

(56) References Cited

U.S. PATENT DOCUMENTS

| | | | |
|---|---|---|---|
| 2017/0248665 | A1 | 8/2017 | Ludwig |
| 2018/0353139 | A1 | 12/2018 | Speier |
| 2018/0353140 | A1 | 12/2018 | Speier |
| 2020/0110145 | A1 | 4/2020 | Zeller |
| 2021/0239778 | A1 | 8/2021 | Bacher |
| 2023/0082926 | A1 | 3/2023 | Bollenbeck |

OTHER PUBLICATIONS

Ludwig et al., Pilot tone-based motion correction for prospective respiratory compensated cardiac cine MRI, Magn Reson Med. 2021; 85: 2403-2416 (Year: 2021).*

Speier et al., Skip the Electrodes, But Not a Beat: The Engineering Behind the Beat Sensor, MAGNETOM Flash (83), Jan. 2023 (Year: 2023).*

Solomon et al., Free-breathing radial imaging using a pilot-tone radiofrequency transmitter for detection of respiratory motion. Magn Reson Med. 2021; 85: 2672-2685 (Year: 2021).*

Madore et al., External Hardware and Sensors, for Improved MRI. J Magn Reson Imaging. Mar. 2023;57(3):690-705 (Year: 2023).*

Chen et al., Design and Validation of a Novel MR-Compatible Sensor for Respiratory Motion Modeling and Correction, in IEEE Transactions on Biomedical Engineering, vol. 64, No. 1, pp. 123-133, Jan. 2017 (Year: 2017).*

Chen, Chong, et al. "Automatic extraction and sign determination of respiratory signal in real-time cardiac magnetic resonance imaging." 2020 IEEE 17th International Symposium on Biomedical Imaging (ISBI). IEEE, 2020. pp. 1-4.

Schroeder, Lea, et al. "Two-dimensional respiratory-motion characterization for continuous MR measurements using pilot tone navigation." Proceedings of the 24th Annual Meeting of ISMRM, Singapore. 2016.

Singh, Aditya, et al. "Optical tracking with two markers for robust prospective motion correction for brain imaging." Magnetic Resonance Materials in Physics, Biology and Medicine 28 (2015): 523-534.

* cited by examiner

METHOD FOR ASSIGNING A SPATIAL ORIENTATION TO A MOVEMENT SIGNAL OF A MOVEMENT OF AN EXAMINATION OBJECT OF A MAGNETIC RESONANCE EXAMINATION, MAGNETIC RESONANCE APPARATUS, AND COMPUTER PROGRAM PRODUCT

This application claims the benefit of German Patent Application No. DE 10 2023 204 096.4, filed on May 3, 2023, which is hereby incorporated by reference in its entirety.

BACKGROUND

The present embodiments relate to a method for assigning a spatial orientation to a movement signal of a movement of an examination object of a magnetic resonance examination, a magnetic resonance apparatus, and a computer program product.

In medical technology, imaging using magnetic resonance (MR), also referred to as magnetic resonance tomography (MRT) or magnetic resonance imaging (MRI) is distinguished by its high soft-tissue contrast levels. Herein, an examination object (e.g., a patient) may be positioned in a magnetic field of an MR apparatus. During an MR scan, high frequency (RF) transmitted pulses are radiated into the examination object, in accordance with an MR sequence. Via the transmitted pulses in combination with the static magnetic field, nuclear spins are excited in the examination object, so that by gradient pulses, spatially encoded MR signals are triggered. The MR signals are received by the MR apparatus and are used for the reconstruction of MR mappings.

In order to achieve a higher quality in the MR mappings, during the MR scan, movement data may be recorded (e.g., one or more movement signals that describe a possible movement of the examination object). Using this, for example, a prospective or retrospective movement correction may be undertaken. Further, movement data may be used for controlling (e.g., synchronizing) the MR sequence with the patient movement.

For the capture of movement data, a technique that utilizes a pilot tone (PT) and is described, for example, in US20160245888 A1, US20170160364 A1 and US20180353139 A1 has been introduced in recent years. Therein, a PT signal is generated with a PT generator and is modulated by a movement of the examination object and received by an HF receiving unit of the MR apparatus. The HF receiving unit has a receiving bandwidth that is large enough to receive the MR signal and simultaneously the PT signal that may not lie in the frequency range of the MR signal. The HF receiving unit may include a plurality of receiving elements (e.g., coil elements that are each associated with a receiving channel).

The received PT signal may be represented, for example, as a matrix. Matrix elements of the matrix (e.g., their dimensions) map the time and/or different receiving channels of the PT signal. The PT signal may contain information regarding different movement components such as breathing movements and heart movements. Of the movement components, PT partial signals that are evoked may become mixed in the PT signal (e.g., linearly); this mixing of the PT partial signals may be described, for example, via a mixing matrix.

Apart from the PT technique, further movement capture methods are known, such as, for example, a movement capture by MR navigators and/or a camera.

SUMMARY AND DESCRIPTION

The scope of the present invention is defined solely by the appended claims and is not affected to any degree by the statements within this summary.

The present embodiments may obviate one or more of the drawbacks or limitations in the related art. For example, accuracy and/or significance of movement capture may be improved. Independent of the grammatical term usage, individuals with male, female, or other gender identities are included within the term.

Accordingly, a method (e.g., computer-implemented) for assigning a spatial orientation to a movement signal of a movement of an examination object of a magnetic resonance examination is provided. Therein, in a capture period, a first movement signal is captured by a first movement capture method. During the capture period (e.g., during the capture of the first movement signal), at least one further movement signal is captured using at least one further movement capture method. A spatial orientation is assigned to at least one component of the first movement signal by comparing the first movement signal with the at least one further movement signal.

The capture of the first movement signal may take place, for example, using a first capture unit. The capture of the at least one further movement signal may take place, for example, using a further capture unit. The assigning of the spatial orientation may take place using an assigning unit to which the first movement signal and the at least one further movement signal are provided. For this purpose, the first capture unit and the at least one further capture unit are connected to the assigning unit (e.g., via signal lines). For example, the assigning unit may include one or more processors and/or storage modules. The assigning unit may be, for example, part of a system control unit of a magnetic resonance apparatus.

Taking account of the associating information of the spatial orientation for at least one component of the first movement signal, a movement correction and/or a controlling of a magnetic resonance examination (e.g., a magnetic resonance scan of a magnetic resonance examination), for example, may be carried out. In one embodiment, movement data regarding the movement of the examination object may be displayed, correctly placed, to operating personnel of a magnetic resonance apparatus.

In one embodiment, the first movement capture method and/or the second movement capture method provides a recording of signals (e.g., movement signals), based on which a movement (e.g., physiological movement) of the examination object may be detected. Such signals may be, for example, pilot tone signals modulated, for example, by a movement of the examination object. Further possible movement capture methods may provide that such signals are MR navigator signals and/or noise correlation signals and/or magnetic field signals captured, for example, by a pick-up coil and/or a Hall effect sensor, and/or laser signals and/or radar signals (e.g., short wave radar signals) and/or optical signals captured, for example, by a camera, and/or acceleration signals.

The capture of the first movement signal and the at least one further movement signal may take place, for example, before, during, and/or after a capture of diagnostic data of a magnetic resonance examination. For example, in the case of a prospective movement correction, with the aid of the first movement capture method, it may be useful that an assignment of the spatial orientation to at least one component of the first movement signal takes place before a capture of diagnostic data of a magnetic resonance examination. In the case of a retrospective movement correction, with the aid of the first movement capture method, an assignment of the spatial orientation to at least one component of the first movement signal may also take place after a capture of diagnostic data of a magnetic resonance examination.

The spatial orientation is, for example, a spatial alignment and/or a spatial direction. For example, the assignment of the spatial orientation includes an identification of a spatial orientation from a plurality (e.g., two, such as two opposing) of possible spatial orientations. The identified spatial orientation of the at least one component of the first movement signal is assigned. For example, the spatial orientation expresses with a sign (e.g., "+" or "−") that the at least one component of the first movement signal is assigned. Accordingly, a possible identification of a spatial orientation may be equal, for example, to a determination of such a sign.

In one embodiment, the spatial orientation of the at least one component of the first movement signal relative to the examination object (e.g., to an anatomy of the examination object) may be specified. For example, such a spatial orientation extends along particular body parts or between particular body parts of the examination object (e.g., the patient, such as between the head and the foot of the patient (head-foot direction) or between the back and the chest of the patient (chest-back direction)).

In one embodiment, the first movement capture method and the at least one further movement capture method differ from one another. In one embodiment, the first movement capture method and the at least one further movement capture method are based upon different physical principles and/or rules and/or physical effects and/or interactions.

In one embodiment, the captured first movement signal and/or the at least one further movement signal may be represented and/or stored and/or processed as a dataset.

In one embodiment, the assignment of the spatial orientation to the at least one component of the first movement signal includes an adaptation of a dataset underlying the first movement signal. For example, a dataset of this type includes a plurality of numerical values, the sign of which is possibly adapted and/or amended dependent upon an assigned spatial orientation.

In one embodiment, the first movement signal is suitable for describing a movement (e.g., a variation over time of the movement of the examination object, such as a movement curve). In one embodiment, the at least one further movement signal is suitable for describing a movement (e.g., a variation over time of the movement) of the examination object. Such a movement may be, for example, a heart and/or breathing movement of the examination object.

In one embodiment, the capture of the first movement signal takes place at the same time and/or simultaneously and/or in parallel with the capture of the at least one further movement signal. In one embodiment, the first movement signal and the at least one further movement signal may be captured interleaved. For example, switching between the receiving of the signals takes place fast enough that the expected movement may be sampled sufficiently accurately in order to enable an assignment of the spatial orientation (e.g., a sign determination).

In one embodiment, the comparison of the first movement signal with the at least one further movement signal includes a contrasting of the first movement signal and of the at least one further movement signal. In one embodiment, the comparison of the first movement signal with the at least one further movement signal includes a correlation analysis and/or a pattern comparison.

In one embodiment, the examination object is a human or animal patient (e.g., a part of a human or animal patient). For example, the examination object is an upper body of a patient.

In one embodiment, via the assigning of a spatial orientation to at least one component of the first movement signal, the movement of the examination object (e.g., its direction) may be determined more exactly. If, for example, what is concerned is a breathing movement of the patient, it is possible to differentiate between an inhaling movement and an exhaling movement. For example, an inhaling movement corresponds to a first sign, and an exhaling movement corresponds to a second sign that is different therefrom.

In one embodiment, based on the at least one further movement signal, the direction of the movement of the examination object is determined. The method of the present embodiments may be used with particularly great usefulness if the first movement signal regarding the actual movement direction of the examination object is not unambiguous. If the first movement capture method supplies, for example, a first movement signal that does not reliably, or does not unambiguously, indicate the direction of the movement, the direction of movement may be determined based on the at least one further movement signal.

In one embodiment, the at least one component of the movement signal may be described by a variation over time of amplitude. The assignment of the spatial orientation to the at least one component includes an assignment of a sign to the amplitude of the respective amplitude variation. In one embodiment, via such an assignment of the sign, the variation over time of amplitude may be calibrated.

The variation over time of amplitude may describe a vectorial component of an overall movement of the examination object. A spatial direction may be assigned to the vectorial component. In one embodiment, the overall movement is composed of vectorial components, each of which is described by a variation over time of amplitude. Therein, the amplitude indicates a strength of a movement of the examination object in the assigned spatial direction.

In one embodiment, the capture of the first movement signal includes an establishment of at least two components of the first movement signal that are suitable for describing the movement of the examination object in respectively another spatial direction. In one embodiment, the capture of the first movement signal includes an establishment of at least two components of the first movement signal that describe the movement of the examination object in respectively another spatial direction.

In one embodiment, a spatial orientation is assigned to each of these at least two components of the first movement signal.

For example, the at least one component of the first movement signal includes a component that is suitable for describing a movement component of the examination object that is oriented parallel to the head-foot direction of the examination object, and/or a component that is suitable for describing a movement component of the examination object that is oriented parallel to the chest-back direction of the examination object.

In one embodiment, the first movement signal includes a pilot tone signal. In one embodiment, the first movement signal consists of one or more pilot tone signals. For example, the pilot tone signal includes a plurality of pilot tone individual signals that are each acquired by a separate coil element of an HF receiving unit.

In one embodiment, the movement capture method is based upon an interaction of a pilot tone signal generated by a pilot tone generator with the moving examination object. In one embodiment, the generated pilot tone signal is modulated by a movement of the examination object and is acquired by the coil elements.

In one embodiment, the magnetic resonance apparatus (e.g., its receiving channels) has a receiving bandwidth that is large enough to receive simultaneously a magnetic resonance signal and a pilot tone signal that may not lie in the frequency range of the magnetic resonance signal. For further aspects of the pilot tone method, reference is made to the documents US 20160245888 A1, US20170160364 A1, and US20180353139 A1.

For example, each coil element may be part of a respective receiving channel. The captured PT signal may be represented, for example, as a matrix. Matrix elements of the matrix map the time and/or different receiving channels of the PT signal. The PT signals of each receiving channel may contain information regarding different movement components such as breathing movements and heart movements. Of the movement components, PT partial signals that are respectively evoked may become mixed in the PT signal (e.g., linearly); this mixing of the PT partial signals may be described, for example, via a mixing matrix. The mixing matrix may be specified, for example, by the geometry and the sensitivity of the coil elements.

In one embodiment, at least two components of the at least one component of the first movement signal are established by a blind source separation (BSS) algorithm.

For example, the BSS algorithm includes an independent component analysis (ICA) algorithm and/or a principal component analysis (PCA) algorithm (e.g., a complex principle component analysis (cPCA) algorithm).

The use of a BSS algorithm (e.g., an ICA algorithm) provides, for example, that a demixing matrix is calculated from a calibration portion of movement data (e.g., a PT signal). The ICA algorithm may be applied, for example, to a plurality of movement data items that are captured, for example, via different receiving channels. In one embodiment, a demixing matrix separates signals of different movement types in the movement data. If a signal of only one movement type is extracted from the movement data, this may also take place with the aid of a demixing vector.

For example, the demixing matrix, when the demixing matrix is applied to a PT signal, separates at least one particular movement type including, for example, the breathing and/or heart components, from other possible signal components. Dependent upon the implementation of the ICA algorithm, this demixing matrix may have either complex or real values. With regard to further possible aspects of the ICA algorithm or the PCA algorithm, reference is made to the document EP 3413076 A1.

The at least one component of the first movement signal may be, for example, output data of a BSS algorithm that is applied to the first movement signal as input data of the BSS algorithm.

For example, a first component established by the BSS algorithm is a variation over time of amplitude that describes a movement of the examination object parallel to the head-foot direction of the examination object. For example, a second component established by the BSS algorithm is a variation over time of amplitude that describes a movement of the examination object parallel to the chest-back direction of the examination object. Such variation over time of amplitudes may also be represented as movement curves. In one embodiment, a spatial orientation may be assigned to each of these movement curves so that, for example, an inhalation movement and an exhalation movement of the patient may be described in a spatially correct manner and may thereby be correctly identified.

In one embodiment, the at least one further movement signal includes a magnetic field signal and/or an acceleration signal.

The magnetic field signal may describe a strength and/or a direction of a magnetic field. The magnetic field may be a magnetic field that has been generated by a magnetic resonance apparatus with which the magnetic resonance examination of the examination object is to be carried out. In one embodiment, such a magnetic field includes or is a main magnet field (e.g., a B0 field). This may be generated, for example, with a superconducting magnet. The strength of the magnetic field is, for example, 0.55 T, 1.5 T, 3 T, or 7 T.

In one embodiment, dependent upon location, the magnetic field has a different magnetic field strength (e.g., the magnetic field is not completely homogeneous). In one embodiment, a spatial information item may be assigned to the magnetic field signal. In one embodiment, the magnetic field signal includes a magnetic field strength (e.g., a magnetic field strength may be established from the magnetic field signal). In one embodiment, a magnetic field distribution that indicates a magnetic field strength dependent upon location is present. In one embodiment, a position relative to the magnetic resonance apparatus may be assigned, based on the magnetic field distribution and the magnetic field strength of the magnetic field signal, to the location at which the magnetic field signal is captured.

The magnetic field distribution may, for example, be measured and/or calculated. The magnetic field distribution may be provided, for example, in the form of a B0 map.

The acceleration signal may describe a strength and/or a direction of an acceleration. From an acceleration, via a single integration over time, a speed, and via a double integration over time (e.g., a single integration over time of the speed), a location may be calculated.

In one embodiment, the at least one further movement signal is captured, for example, in each case, by a sensor (e.g., a separate sensor) that is also moved via the movement of an examination object. In one embodiment, the at least one further movement signal is captured, for example, in each case, by a sensor (e.g., a separate sensor) that is arranged in or on an apparatus arranged on the examination object. The apparatus is also moved via the movement of an examination object. For example, the magnetic field signal and/or an acceleration signal is captured, for example, in each case by a sensor that is arranged in or on an apparatus arranged on the examination object. The apparatus is also moved via the movement of an examination object.

The magnetic field signal is captured, for example, by a Hall effect sensor (e.g., a 3D Hall effect sensor). For example, the Hall effect sensor generates, via a movement in the magnetic field of the magnetic resonance apparatus, one or more of the at least one further movement signal. A Hall effect sensor in principle uses the Hall effect for measuring magnetic fields. Above all, outside the field of view (FOV) (e.g., outside a bore of the magnetic resonance apparatus), the spatial distribution of the magnetic field may be inhomogeneous but is known; accordingly, using a strength of the magnetic field measured via the Hall effect sensor, the spatial position of the Hall effect sensor may be determined.

It is also possible to impress a spatial dependency on the magnetic field in the visual field. This may (also) take place during a magnetic resonance scan. The impressing of the spatial dependency may take place, for example, using an application of gradient magnetic fields via a gradient coil unit of the magnetic resonance apparatus and/or an application of shim magnetic fields via a shim coil unit of the magnetic resonance apparatus. In one embodiment, via the spatial dependency, a sensitivity for the movement and/or position of the Hall effect sensor is generated in at least one spatial direction. When using a sequence of different gradients or shim pulses, movements and positions may, for example, be detected in a plurality of (e.g., in all) spatial directions.

The acceleration signal is captured, for example, by an acceleration sensor. An acceleration sensor (e.g., also acceleration meter, accelerometer, vibration sensor, oscillation sensor, G-meter) is a sensor that measures its acceleration. The acceleration sensor may supply acceleration values in three spatial directions.

In one embodiment, a further movement signal may be captured by a gyro sensor. A gyro sensor may be configured to measure angular velocities. In one embodiment, with a gyro sensor, a dynamic acceleration due to the movement of the examination object and/or of the acceleration sensor and a static acceleration due to the gravitation of the Earth may be separated.

The apparatus arranged in or on the examination object may be, for example, a local coil. A local coil (e.g., a surface coil) may include one or more coil elements that are configured for receiving and/or transmitting high frequency signals. For example, magnetic resonance signals may be received, and/or excitation signals for exciting magnetic resonance signals may be transmitted.

The sensor capturing the at least one further movement signal may be connected, for example, via a signal line to the assigning unit that carries out the assigning of a spatial orientation to at least one component of the first movement signal by comparing the first movement signal with the at least one further movement signal. In the event that the at least one sensor for capturing the at least one further movement signal is arranged in or on a local coil, the aforementioned signal line may be arranged, for example, in the same cable that also serves for transferring magnetic resonance signals during the magnetic resonance examination.

For example, the at least one further movement signal is suitable for describing the movement of the examination object in one (e.g., only one) single spatial direction that is assigned to one of at least two components of the first movement signal. A spatial orientation is assigned to at least one further of the at least two components of the first movement signal based on the at least one further movement signal and of prior knowledge regarding the examination object.

In one embodiment, the movement directions of the components of the first movement signal are coupled. The knowledge regarding this coupling represents, for example, a prior knowledge item of this type.

A prior knowledge item of this type may consist, for example, in that during a partial movement, the examination object carries out a partial movement along a spatial direction (e.g., the chest-back direction) in a particular direction (e.g., the direction of the chest) and simultaneously the examination object carries out a partial movement along another spatial direction (e.g., the head-foot direction) in a particular direction (e.g., the direction of the head).

In one embodiment, on use of such a prior knowledge item, it is possible, from an assigned spatial orientation of a first component of the first movement signal, to derive the spatial orientation of a further component of the first movement signal.

In one embodiment, the at least one further movement signal is suitable for describing the movement of the examination object in a spatial direction parallel to the chest-back direction of the examination object. In one embodiment, therefrom, it is possible to deduce the spatial orientation of the movement in the chest-back direction as the first component of the first movement signal; in addition, with prior knowledge, the spatial orientation of the movement in the head-foot direction as the second component of the first movement signal may be deduced.

In one embodiment, the method includes a quantitative calibration of the first movement signal using the at least one further movement signal. For example, a geometric scale is assigned to the first movement signal using the at least one further movement signal.

For example, using the at least one further movement signal, a length using which an amplitude of an amplitude variation of a component of the first movement signal is calibrated may be determined.

For example, from a further movement signal such as, for example, a magnetic field signal and/or an acceleration signal, a length of a movement of the examination object in a spatial direction may be established. Such a movement may be, for example, a breathing movement that has a length in the chest-back direction that is to be determined based on the further movement signal. This length may correspond to an amplitude of an amplitude variation of a component of the first movement signal in this spatial direction.

In one embodiment, the method includes a removal of a drift portion from the first movement signal based on the at least one further movement signal. In one embodiment, the at least one further movement signal is free from a drift. This is advantageous, particularly in the case of pilot tone signals as the first movement signals, since pilot tone signals often have a non-physiological drift portion.

Further, a magnetic resonance apparatus that is configured to carry out a method as described above is provided.

The advantages of the magnetic resonance apparatus of the present embodiments substantially correspond to the advantages of the method of the present embodiments for assigning a spatial orientation to a movement signal of a movement of an examination object of a magnetic resonance examination, as described in detail above. Features, advantages, or alternative embodiments mentioned herein may also be transferred to the other subject matter and vice versa.

Further, a computer program product that includes a program and is directly loadable into a memory store of a programmable system control unit of a magnetic resonance apparatus, and includes program means (e.g., libraries and auxiliary functions) in order to carry out a method of the present embodiments when the computer program product is executed in the system control unit of the magnetic resonance apparatus. The computer program product may therein include an item of software with a source code that is still to be compiled and linked or is only to be interpreted, or an executable software code that, for execution, is only to be loaded into the system control unit.

Via the computer program product, the method of the present embodiments may be carried out rapidly, exactly reproducibly, and robustly. The computer program product may be configured so that the computer program product may carry out the method acts of the present embodiments by the system control unit. In each case, the system control unit therein has the pre-conditions such as, for example, a suitable working memory store, a suitable graphics card, or a suitable logic unit so that the respective method acts may be carried out efficiently.

The computer program product is stored, for example, on a computer-readable medium (e.g., a non-transitory computer-readable storage medium) or is deposited on a network or server from where the computer program product may be loaded into the processor of a local system control unit that may be directly connected to the magnetic resonance apparatus or may be configured as part of the magnetic resonance apparatus. Further, control information of the computer program product may be stored on an electronically readable data carrier. The items of control information of the electronically readable data carrier may be configured such that the items of control information carry out a method of the present embodiments when the data carrier is used in a system control unit of a magnetic resonance apparatus.

Examples of electronically readable data carriers are a DVD, a magnetic tape, or a USB stick, on which electronically readable control information (e.g., software) is stored. If this control information is read from the data carrier and stored in a system control unit of the magnetic resonance apparatus, all the embodiments of the above-described methods may be carried out.

Further advantages, features, and details are disclosed in the example embodiments described below and in the drawings. Parts that correspond to one another are provided with the same reference signs in all the drawings.

DETAILED DESCRIPTION

Figure 1:
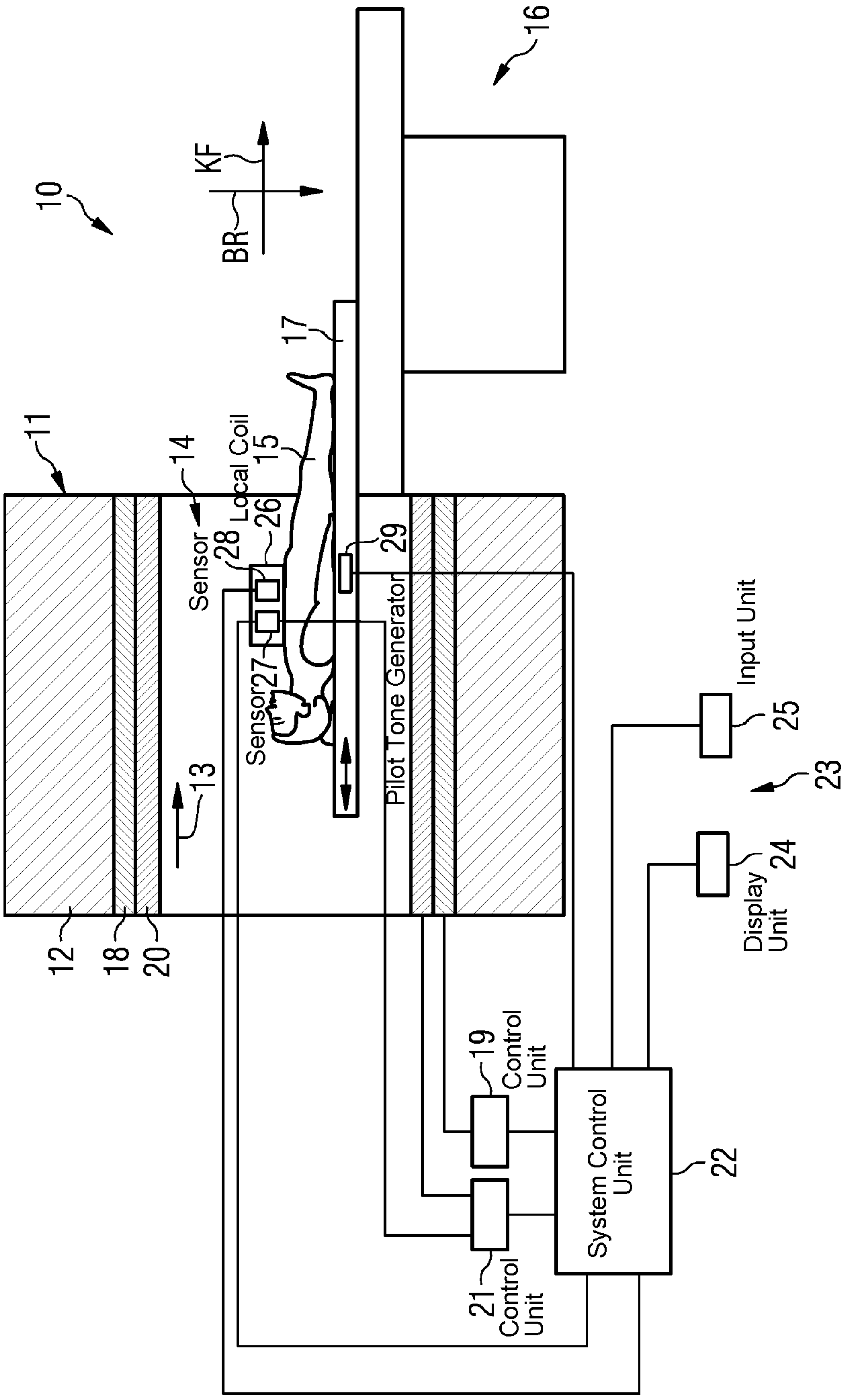
FIG. 1 shows a magnetic resonance apparatus with an upper body of a patient as an examination object.

In FIG. 1, a magnetic resonance apparatus 10 is shown schematically. The magnetic resonance apparatus 10 includes a magnet unit 11 that has a main magnet 12 for generating a strong and, for example, temporally constant main magnet field 13 (also known as the B0 field). In addition, the magnetic resonance apparatus 10 includes a patient receiving region 14 (e.g., in the form of a bore) for accommodating a patient 15 as the examination object. In the present example embodiment, the patient receiving region 14 is configured cylindrical and is surrounded cylindrically in a circumferential direction by the magnet unit 11. In principle, however, an embodiment of the patient receiving region 14 deviating therefrom may be provided. The patient 15 may be moved by a patient positioning apparatus 16 of the magnetic resonance apparatus 10 into the patient receiving region 14. For this purpose, the patient positioning apparatus 16 has a patient table 17 that is configured to be movable within the patient receiving region 14 and on which the patient 15 is positioned lying on his back.

The magnet unit 11 also has a gradient coil unit 18 for generating a gradient magnetic field that is used for position encoding during imaging. The gradient coil unit 18 is controlled by a gradient control unit 19 of the magnetic resonance apparatus 10. The magnet unit 11 further includes a high frequency antenna unit 20 that is configured in the present example embodiment as a body coil that is fixedly integrated into the magnetic resonance apparatus 10. The high frequency antenna unit 20 is controlled by a high frequency antenna control unit 21 of the magnetic resonance apparatus 10 and radiates high frequency excitation pulses into an examination object (e.g., the upper body of the patient 15). By this, an excitation of atomic nuclei by the main magnet field 13 generated by the main magnet 12 takes place. Through relaxation of the excited atomic nuclei, magnetic resonance signals are generated. The high frequency antenna unit 20 is configured for receiving the magnetic resonance signals and therefore represents a part of an HF receiving unit of the magnetic resonance apparatus.

Further, the magnetic resonance apparatus 10 includes, for example, as part of the high frequency antenna unit 20, a local coil 26 that is arranged on the chest of the patient 15. The local coil 26 may, for example, be fixedly attached to the patient 15 with straps. A local coil 26 of this type is, for example, a body array coil with a plurality of coil elements. The local coil 26 is therefore an apparatus that is arranged on the upper body as the examination object. The local coil 26 is moved via the movement of the examination object (e.g., via a movement of a chest of the patient 15). The local coil 26 is configured for receiving the magnetic resonance signals. In one embodiment, the local coil 26 is mounted in the vicinity of the region of the patient 15 that is to be recorded by a magnetic resonance scan. The magnetic resonance signals arising in this region may thereby be captured with a particularly high signal-to-noise ratio. In one embodiment, however, the local coil 26 is configured for transmitting high frequency excitation pulses.

For controlling the main magnet 12, the gradient control unit 19 and, for controlling the high frequency antenna control unit 21, the magnetic resonance apparatus 10 have a system control unit 22. The system control unit 22 centrally controls the magnetic resonance apparatus 10, such as, for example, the execution of a magnetic resonance sequence. In addition, the system control unit 22 includes an evaluation unit (not shown in detail) for evaluating the magnetic resonance signals that are captured during the magnetic resonance examination. Further, the magnetic resonance apparatus 10 includes a user interface 23 that is connected to the system control unit 22. Control information such as, for example, imaging parameters and reconstructed magnetic resonance mappings may be displayed on a display unit 24 (e.g., on at least one monitor of the user interface 23 for medical operating personnel). Further, the user interface 23 has an input unit 25 by which information and/or parameters may be input by the medical operating personnel during a scanning procedure.

In order to carry out a movement capture method, a pilot tone method, the magnetic resonance apparatus further includes a pilot tone generator 29 that is arranged, for example, in the patient table 17. The PT method is an electromagnetic, contactless movement capture method. According to this method, the PT generator generates a PT signal that is modulated (e.g., via a movement of the upper body of the patient 15) and is captured by the HF receiving unit of the magnetic resonance apparatus 10 (e.g., by the local coil 26) as the first movement signal. This movement capture method therefore includes an interaction of the PT signal with the moving examination object. The PT generator 29 may be controlled, for example, by the system control unit 22. In one embodiment, the local coil 26 has a receiving bandwidth that is large enough to receive simultaneously the magnetic resonance signal and the PT signal, which does not lie in the frequency range of the MR signal. The local coil 26 may include a plurality of receiving elements (e.g., coil elements) that are each assigned to a receiving channel.

The local coil 26 includes a magnetic field sensor, in the form of a Hall effect sensor 27, and an acceleration sensor 28, with which, according to further movement detection methods, second movement signals may be captured. The magnetic resonance apparatus 10 may also have further sensors for capturing second movement data, such as, for example, a gyro sensor. The sensors 27, 28 are integrated, for example, in the local coil 26. Via the movement of the examination object (e.g., via the movement of the chest of the patient 15), the sensors 27, 28 are moved together with the local coil 26. For example, in examinations of the heart and/or the abdomen and/or the breast of the patient, in this way, a mechanical connection of the sensors 27, 28 with the movement of the ribcage of the patient 15 may be created.

With the sensors 27, 28, second movement signals may be recorded. For this reason, the sensors 27, 28 may be designated movement sensors. The Hall effect sensor 27 and the acceleration sensor 28 rely upon different physical interactions for detecting the movement of the patient 15. While the Hall effect sensor 27 interacts with the main magnet field 13, and thus the signal generation relies upon a magnetic force, the signal generation of the acceleration sensor 28 relies upon the inertial force.

In FIG. 1, the sensors 27, 28 are arranged beneath the bore of the magnetic resonance apparatus. The capture of the second movement data by the sensors 27, 28 may, however, also take place entirely or partially outside the bore.

Within the bore, the main magnet field 13 is typically very homogeneous so that a resolution of a typical Hall effect sensor (e.g., 0.1 mT) may not be sufficient to detect typical field inhomogeneities (e.g., 500 nT). Therefore, translation coordinates (e.g., x, y, z) in the bore may not be determined readily. For example, in the case shown in FIG. 1 in which the local coil 26 is wound, for example, round the patient 15, larger translational movements of the sensors 27, 28 may not take place through, for example, breathing and/or coughing by the patient 15; such movements typically amount to a maximum of a few centimeters. However, apart from the translation portion, such movements may also include a rotation portion (e.g., rotational movements such as twisting, tilting, and/or inclining). In one embodiment, such rotation movements may be determined very exactly as second movement data. The homogeneous main magnet field 13 may have only one component $B0_z$ in the bore that is not equal to zero. The components $B0_x$ and $B0_y$ may be equal to zero. A portion of the rotational movement of the local coil 26 may thus be calculated from the amended movement data $Hall_x$, $Hall_y$, $Hall_z$ of the Hall effect sensor: $Hall_x$, $Hall_y$, $Hall_z$ also change as projections of the magnetic field component $B0_z$ in the homogeneous main magnet field 13 of the bore. For example, signals that are captured by a gyro sensor arranged in or on the local coil 26 may be input into such a calculation; such signals may include information regarding angular velocities of the rotations of the local coil 26.

The sensors 27, 28 transmit the captured second movement data to the system control unit 22 for further evaluation.

The movement of the examination object (e.g., in this case, the upper body of the patient 15) may be divided into two or more partial movements. A first partial movement takes place, for example, parallel to the chest-back direction BR of the upper body; a second partial movement takes place, for example, parallel to the head-foot direction KF of the upper body. The overall movement of the upper body may be described, for example, as an overlaying of these two movements.

Figure 2:
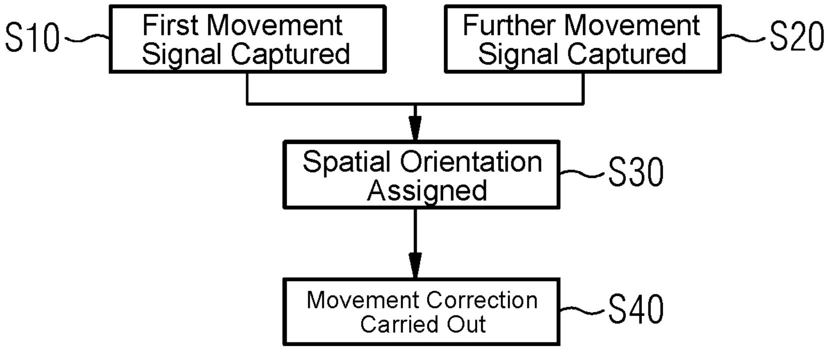
FIG. 2 shows an embodiment of a method in a schematic representation.

In FIG. 2, a method for assigning a spatial orientation to a movement signal of a movement of an examination object of a magnetic resonance examination is represented schematically.

In S10, a first movement signal of a movement is captured by a first movement capture method. The movement is a movement of the upper body (e.g., the lungs) of the patient that is occurring here: via the expansion of the lungs during inhalation, a movement of the ribcage takes place in the chest-back direction BR as well as a movement, primarily, of the diaphragm and the liver in the head-foot direction KF. The first movement signal may be, for example, a pilot tone signal. The pilot signal includes, for example, two components: a first component describes the movement of the upper body (e.g., the ribcage) of the patient 15 in the chest-back direction BR; a first component describes the movement of the upper body of the patient 15 in the head-foot direction KF. The partial movements and/or signal components may each have two orientations: the first partial movement may take place toward the chest (e.g., in this case, therefore, upwardly) or toward the back (e.g., in this case, therefore, downwardly); the second partial movement may take place toward the head (e.g., in this case, therefore, to the left) or toward the foot (e.g., in this case, therefore, to the right).

In S20, at least one further movement signal is captured by at least one further movement capture method during the capture of the first movement signal. Such a further movement signal may be, for example, any signal that is suitable for establishing the orientation of at least one of the partial movements mentioned. For example, the orientation of both partial movements may be established directly. In one embodiment, the orientation of one of the two partial movements is established directly, and the other of the two partial movements is derived therefrom (e.g., using prior knowledge). For example, a prior knowledge item may be that, during a movement of the ribcage of the upper body toward the chest, the lung of the upper body also simultaneously carries out a movement toward the head (e.g., that these two partial movements are coupled).

In S30, a spatial orientation is assigned to at least one component of the first movement signal by comparing the first movement signal with the at least one further movement signal.

In S40, based on the first movement signal calibrated in S30, for example, a movement correction may be carried out in a more targeted and/or more precise manner. Further, for example, a magnetic resonance scan may be carried out with the magnetic resonance apparatus 10. In this magnetic resonance scan, the first movement capture method calibrated in S30 is used.

Figure 3:
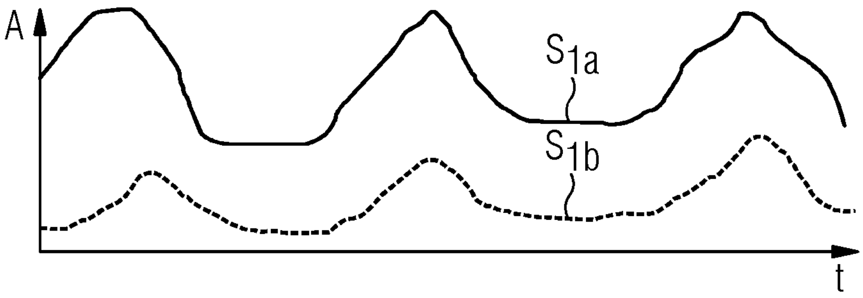
FIG. 3 shows two components of a first movement signal in the form of an amplitude variation in each case.

With the aid of FIGS. 3, 4, and 5, the method will now be described using a further example. In FIG. 3, two components $S_{1a}$ and $S_{1b}$ of the first movement signal are shown in the form of a variation over time of amplitude in each case. The amplitude variation is represented as an amplitude A in dependence upon time t.

Two such components $S_{1a}$, $S_{1b}$ may be, for example, output data of a BSS algorithm that is applied to a first movement signal (e.g., a pilot tone signal) as input data. The pilot tone signal may be modulated, for example, via a breathing movement that the examination object carries out.

In this case, the BSS algorithm outputs two amplitude variations: The amplitude variation of the component Sla describes the partial movement in the chest-back direction; and the amplitude variation of the component $S_{1b}$ describes the partial movement in the head-foot direction. The components $S_{1a}$, $S_{1b}$ of the first movement signal therefore describe the movement of the examination object, each in a different spatial direction.

However, the spatial orientation of the components $S_{1a}$, $S_{1b}$ may be unclear. For example, it may be unclear whether, with increasing value A of the amplitude variation of the component Sla, a movement toward the chest (−BR) (e.g., an inhaling movement) or toward the back (+BR) (e.g., an exhaling movement) is being described.

Figure 4:
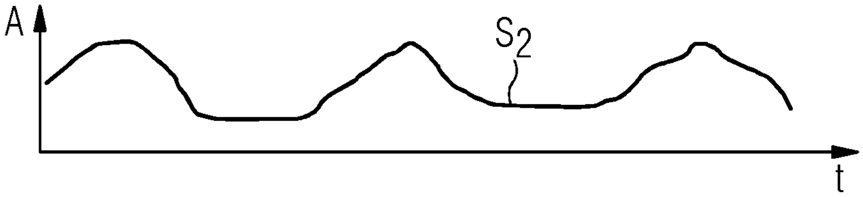
FIG. 4 shows a first further movement signal in the form of an amplitude variation.
Figure 5:
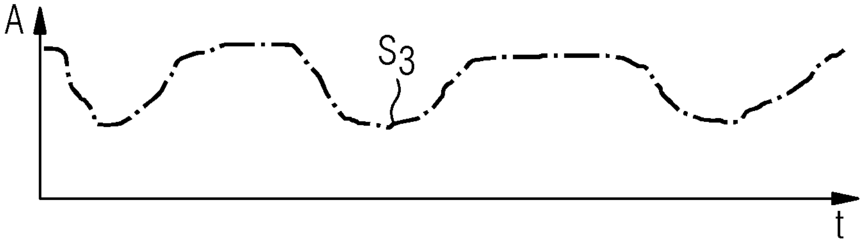
FIG. 5 shows a second further movement signal in the form of an amplitude variation.

In FIGS. 4 and 5, a sensor signal is shown, in each case, as a further movement signal: the signal $S_2$ in FIG. 4 is an acceleration signal that is recorded, for example, with the acceleration sensor 28. The signal $S_3$ in FIG. 5 is a magnetic field signal that is recorded, for example, with the Hall effect sensor 27. Both sensors 27, 28 are positioned in the local coil 26, so that the sensors 27, 28 move together with the ribcage when the patient 15 breathes. In one embodiment, the spatial orientation of the further movement signals $S_2$, $S_3$ is known.

Thus, for example, the amplitude A of the magnetic field signal $S_3$ rises on movement in the chest-back direction BR toward the chest (−BR) (e.g., during an inhalation); accordingly, the amplitude A of the magnetic field signal $S_2$ falls on movement in the chest-back direction BR toward the back (+BR) (e.g., during an exhalation). Knowledge of the spatial orientation of the magnetic field signal $S_2$ may be derived, for example, from a recognition of the magnetic field distribution in the patient receiving region 14, so that from a measured magnetic field strength, it is possible to deduce a location at which the Hall effect sensor 27 is currently situated.

Further, with the acceleration sensor, it is also known in which direction the acceleration due to gravity acts, specifically downwardly (e.g., if the patient 15 lies on his back, toward the back; if the patient 15 lies on his front, toward the chest). Thus, the spatial orientation of the acceleration signal $S_3$ is known. Via integration of the acceleration signal $S_3$, a spatial information item may be calculated.

In S30, an assignment of the spatial orientation to the component $S_{1a}$ of the first movement signal takes place by comparing the first movement signal with the at least one further movement signal. This may take place, for example, by a correlation analysis and/or a pattern comparison of the amplitude variation of the components Sla with the amplitude variation of the acceleration signal $S_2$ and/or of the magnetic field signal $S_3$. The assignment of the spatial orientation to the component Sla of the first movement signal may include, for example, an assignment of a sign to the axis of the amplitudes A. The assignment of a negative sign may be regarded, for example, as an inversion of the amplitude A. Via this sign, it may be specified whether, with rising value of the amplitude A, a movement (e.g., a partial movement) of the examination object takes place in one or the other direction.

In the present example, the further movement signals (e.g., the acceleration signal $S_2$ and the magnetic field signal $S_3$) are merely suitable for describing the movement of the examination object in a single spatial direction that is assigned to one of two components of the first movement signal, specifically the component Sla in the chest-back direction BR. By contrast, the acceleration signal $S_2$ and the magnetic field signal $S_3$ do not describe the movement in the head-foot direction KF. However, the component $S_{1b}$ of the first movement signal may be assigned a spatial orientation based on the acceleration signal $S_2$ and/or the magnetic field signal $S_3$ and based on prior knowledge regarding the examination object. Therein, for example, the prior knowledge item is used such that with a partial movement of the upper body (e.g., the ribcage) in the direction toward the chest (−BR), simultaneously, a partial movement of the upper body (e.g., the diaphragm and/or the liver) in the direction toward the head (−KF) takes place. Via such a coupling, an indirect assignment of the spatial orientation to further components of the first movement signal is therefore possible.

Further, use may be made of the fact that the further movement signals $S_2$, $S_3$ are quantitative with regard to the length. For this purpose, the amplitude A of the acceleration signal $S_2$ may be mathematically integrated over time t, and/or a trajectory of the magnetic field signal $S_3$ in the magnetic field (e.g., in the main magnet field 13) may be analyzed. By using quantitative data of the movement signals $S_2$, $S_3$, the pilot tone signal may be assigned to a quantitative measure.

Further, a possible (e.g., movement-independent) drift portion in the pilot tone signal may be removed. Typically, the acceleration signal $S_2$ and the magnetic field signal $S_3$ have no drift, so that the drift portion in the pilot tone signal may be calculated with the aid of the acceleration signal $S_2$ and/or of the magnetic field signal $S_3$. For example, if the drift behavior in possible receiving channels is known, the drift may be removed, for example, by subtraction of the drift portion. In addition, a drift period during a training of the pilot tone signal may be avoided.

The method described above in detail and the magnetic resonance apparatus disclosed are merely example embodiments that may be modified by a person skilled in the art in a wide variety of ways without departing from the scope of the invention. Further, the use of the indefinite article "a" or "an" does not preclude the possibility that the relevant features may also be present plurally. Similarly, the expression "unit" does not preclude the relevant components consisting of a plurality of cooperating sub-components that may also be spatially distributed, if appropriate.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for assigning a spatial orientation to a movement signal of a movement of an examination object of a magnetic resonance examination, the method comprising:

capturing a first movement signal in a capture period using a first movement capture method, the first movement signal having a first component and a second component;

capturing at least one further movement signal using at least one further movement capture method during the capture period;

assigning a spatial orientation to the first component or the second component of the first movement signal, the assigning comprising comparing the first movement signal with the at least one further movement signal;

determining the movement of the examination object using the assigned spatial orientation; and imaging the examination object using the determined movement.

2. The method of claim 1, wherein the first component and the second component of the first movement signal are described by a variation over time of amplitude, and wherein the assigning of the spatial orientation to the first component or the second component comprises assigning a sign to the amplitude of the respective amplitude variation.

3. The method of claim 1, wherein capturing the first movement signal comprises establishing at least two components of the first movement signal that are suitable for describing the movement of the examination object in respectively another spatial direction, the at least two components of the first movement signal comprising the first component and the second component of the first movement signal.

4. The method of claim 1, wherein the first component is suitable for describing a movement component of the examination object, the first component being oriented parallel to a head-foot direction of the examination object, and wherein the second component is suitable for describing a movement component of the examination object, the second component being oriented parallel to a chest-back direction of the examination object.

5. The method of claim 1, wherein the comparison of the first movement signal with the at least one further movement signal comprises a correlation analysis, a pattern comparison, or the correlation analysis and the pattern comparison.

6. The method of claim 1, wherein the first movement signal comprises a pilot tone signal.

7. The method of claim 1, wherein the first component and the second component of the first movement signal are established by a BSS algorithm.

8. The method of claim 7, wherein the BSS algorithm is an ICA algorithm, a PCA algorithm, or a combination thereof.

9. The method of claim 1, wherein the at least one further movement signal comprises a magnetic field signal, an acceleration signal, or a combination thereof.

10. The method of claim 1, wherein the at least one further movement signal is captured by a sensor that is arranged in or on an apparatus arranged on the examination object, and wherein the apparatus is also moved via the movement of the examination object.

11. The method of claim 1, wherein the at least one further movement signal is suitable for describing the movement of the examination object in one single spatial direction that is assigned to one of at least two components of the first movement signal, the at least two components of the first movement signal comprising the first component and the second component of the first movement signal, and wherein a spatial orientation is assigned to at least one further of the at least two components of the first movement signal based on the at least one further movement signal and prior knowledge regarding the examination object.

12. The method of claim 1, wherein the at least one further movement signal is suitable for describing the movement of the examination object in a spatial direction parallel to a chest-back direction of the examination object.

13. The method of claim 1, further comprising assigning a geometric scale to the first movement signal using the at least one further movement signal.

14. The method of claim 1, wherein the method further comprising removing a drift portion from the first movement signal based on the at least one further movement signal.

15. A magnetic resonance apparatus comprising:

a processor configured to assign a spatial orientation to a movement signal of a movement of an examination object of a magnetic resonance examination, the processor being configured to assign the spatial orientation to the movement signals comprising the processor being configured to:

capture a first movement signal in a capture period using a first movement capture method, the first movement signal having a first component and a second component;

capture at least one further movement signal using at least one further movement capture method during the capture period;

assign a spatial orientation to the first component or the second component of the first movement signal, the assignment comprising a comparison of the first movement signal with the at least one further movement signal; and determine the movement of the examination object using the assigned spatial orientation.

16. In a non-transitory computer-readable storage medium that stores instructions executable by one or more processors to assign a spatial orientation to a movement signal of a movement of an examination object of a magnetic resonance examination, the instructions comprising:

capturing a first movement signal in a capture period using a first movement capture method, the first movement signal having a first component and a second component;

capturing at least one further movement signal using at least one further movement capture method during the capture period;

assigning a spatial orientation to the first component or the second component of the first movement signal, the assigning comprising comparing the first movement signal with the at least one further movement signal; and determining the movement of the examination object using the assigned spatial orientation.

17. The non-transitory computer-readable storage medium of claim 16, wherein the first component and the second component of the first movement signal are described by a variation over time of amplitude, and wherein the assigning of the spatial orientation to the first component or the second component comprises assigning a sign to the amplitude of the respective amplitude variation.

18. The non-transitory computer-readable storage medium of claim 16, wherein capturing the first movement signal comprises establishing at least two components of the first movement signal that are suitable for describing the movement of the examination object in respectively another spatial direction, the at least two components of the first movement signal comprising the first component and the second component of the first movement signal.

19. The non-transitory computer-readable storage medium of claim 16, wherein the first component is suitable for describing a movement component of the examination object, the first component being oriented parallel to a head-foot direction of the examination object, and wherein the second component is suitable for describing a movement component of the examination object, the second component being oriented parallel to a chest-back direction of the examination object.

* * * * *